(12) United States Patent
Lin et al.

(10) Patent No.: US 9,348,770 B1
(45) Date of Patent: May 24, 2016

(54) NON-VOLATILE SEMICONDUCTOR MEMORY DEVICE WITH TEMPORARY DATA RETENTION CELLS AND CONTROL METHOD THEREOF

(71) Applicant: Industrial Technology Research Institute, Hsinchu (TW)

(72) Inventors: Keng-Yu Lin, Taichung (TW); Wei-Xiang Tang, Kaohsiung (TW); Po-Han Huang, Hsinchu County (TW); Chih-Wei Hsu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/576,226

(22) Filed: Dec. 19, 2014

(30) Foreign Application Priority Data

Nov. 20, 2014 (TW) .............................. 103140234 A (51) Int. Cl.
*G06F 13/00* (2006.01)
*G11C 7/10* (2006.01)
*G11C 5/06* (2006.01)
*H03K 3/3562* (2006.01)

(52) U.S. Cl.
CPC *G06F 13/00* (2013.01); *G11C 5/06* (2013.01); *G11C 7/1051* (2013.01); *G11C 7/1087* (2013.01); *H03K 3/35625* (2013.01)

(58) Field of Classification Search
CPC ............................ G06F 13/00; H03K 3/35625
See application file for complete search history.

(56) References Cited

U.S. PATENT DOCUMENTS

| 8,504,850 | B2 | 8/2013 | Wu et al. |
| 8,773,913 | B1 | 7/2014 | Zonte et al. |
| 2008/0195876 | A1 | 8/2008 | Priel et al. |
| 2008/0307244 | A1 | 12/2008 | Bertelsen et al. |
| 2012/0310063 | A1 | 12/2012 | Wang et al. |
| 2013/0070515 | A1 | 3/2013 | Mayhew et al. |
| 2013/0127507 | A1* | 5/2013 | Zhuang .............. H03K 3/35625 327/203 |

(Continued)

FOREIGN PATENT DOCUMENTS

| CN | 102981591 | 3/2013 |
| TW | 201346767 | 11/2013 |

(Continued)

OTHER PUBLICATIONS

Khanna et al., "An FRAM-Based Nonvolatile Logic MCU SoC Exhibiting 100% Digital State Retention at VDD=0 V Achieving Zero Leakage With < 400-ns Wakeup Time for ULP Applications," IEEE Journal of Solid-State Circuits, Jan. 2014, pp. 95-106.

(Continued)

*Primary Examiner* — Richard Elms
*Assistant Examiner* — Ajay Ojha
(74) *Attorney, Agent, or Firm* — Jianq Chyun IP Office (57) ABSTRACT

A non-violate memory device and a control method thereof are provided. The non-violate memory device includes a flip-flop, a retention cell and a memory cell. The flip-flop includes an output inverter. The flip-flop generates a second data according to a first data and a retention signal. The retention cell is coupled to the output inverter of the flip-flop. The retention cell temporarily stores the second data when the retention signal is enabled. During the period that retention signal is enabled, the memory cell stores the second data temporarily stored by the retention cell. Thus, another operation mode of the non-violate memory device is provided to save more power.

14 Claims, 4 Drawing Sheets

(56) References Cited

U.S. PATENT DOCUMENTS

| | | | |
|---|---|---|---|
| 2013/0132753 A1 | 5/2013 | Priel et al. | |
| 2013/0223135 A1 | 8/2013 | Koyama | |
| 2013/0315011 A1 | 11/2013 | Takahashi et al. | |
| 2014/0075233 A1* | 3/2014 | Bartling | G06F 13/00 713/324 |

FOREIGN PATENT DOCUMENTS

| | | |
|---|---|---|
| TW | I436199 | 5/2014 |
| TW | 201438008 | 10/2014 |

OTHER PUBLICATIONS

Sakimura et al., "A 90nm 20MHz Fully Nonvolatile Microcontroller for Standby-Power-Critical Applications," 2014 IEEE International Solid-State Circuits Conference, Feb. 11, 2014, pp. 184-185.

Tokunaga et al., "A Graphics Execution Core in 22nm CMOS Featuring Adaptive Clocking, Selective Boosting and State-Retentive Sleep," 2014 IEEE International Solid-State Circuits Conference, Feb. 10, 2014, pp. 108-109.

Arakawa et al., "Implementation of Normally-off Function for TOPPERS/ASP Kernel," 2013 IEEE 2nd Global Conference on Consumer Electronics, Oct. 1-4, 2013, pp. 85-89.

Hayashikoshi et al., "Normally-Off MCU Architecture for Low-power Sensor Node," 2014 19th Asia and South Pacific Design Automation Conference (ASP-DAC), Jan. 20-23, 2014, pp. 12-16.

Ohshima et al., "A normally-off microcontroller unit with an 85% power overhead reduction based on crystalline indium gallium zinc oxide field effect transistors," Japanese Journal of Applied Physics, Feb. 28, 2014, pp. 04EE02-1-04EE02-9.

"Office Action of Taiwan Counterpart Application", issued on Dec. 16, 2015, p. 1-7.

* cited by examiner

NON-VOLATILE SEMICONDUCTOR MEMORY DEVICE WITH TEMPORARY DATA RETENTION CELLS AND CONTROL METHOD THEREOF

CROSS-REFERENCE TO RELATED APPLICATION

This application claims the priority benefit of Taiwan application serial no. 103140234, filed on Nov. 20, 2014. The entirety of the above-mentioned patent application is hereby incorporated by reference herein and made a part of this specification.

TECHNICAL FIELD

The disclosure relates to a technology of storing and retrieving data of a memory and a control method thereof.

BACKGROUND

Through the continuous development of the technology of integrated circuits, one system-on-chip (SOC) has more and more components and functions. However, the power consumption of SOC also increases. Therefore, how to reduce the power consumption of the SOC has become the trend of follow-up research. Generally speaking, electronic devices (e.g. wearable electronic devices, communication devices, etc.) are expected to operate for a long period of time and have a thinner and lighter design. Therefore, the battery capacity of these electronic devices is limited.

For such reasons, an SOC is usually designed to have two modes. One of the modes is the active mode that allows the SOC to operate normally. In the active mode, power is supplied to respective components in the SOC normally, so as to fully perform functions of the SOC. The other mode is a normally-off mode used when the SOC is not in use for a long period of time. In the normally-off mode, data in all computing components in the SOC are firstly stored to a non-volatile memory, and then power supply to the computing components is turned off to significantly reduce power consumption of the SOC. When the SOC returns from the normally-off mode to the active mode, the data is read from the non-volatile memory to each of the computing component. Then, the data are validated to prevent errors when retrieving the data from the non-volatile memory. However, since the SOC in the normally-off mode still needs to transmit the data from the computing components to the non-volatile memory or read from the non-volatile memory, and such operation requires some execution time, power still need to be supplied to other computing components and relevant circuits, resulting in additional power consumption. Therefore, the normally-off mode is only suitable when an electronic device is idling for a long period of time. For example, the operation cycle of the normally-off mode need to be longer than the break-even time (BET).

SUMMARY

One of embodiments of the disclosure provides a non-volatile memory device and a control method thereof. The non-volatile memory device is capable of reducing stand-by power consumption of other core elements and part of circuits during data storing by a retention cell.

An embodiment of the disclosure provides a non-volatile memory device including a flip-flop, a retention cell, and a memory cell. The flip-flop includes an output inverter. The flip-flop generates a second data according to a first data and a retention signal. The retention cell is coupled to the output inverter of the flip-flop. The retention cell temporarily stores the second data when the retention signal is enabled. The memory cell is coupled to the flip-flop and the retention cell. The memory cell is configured to store the second data.

From another perspective, an embodiment of the disclosure provides a control method of a non-volatile memory device. In addition, the non-volatile memory device includes a flip-flop, a retention cell, and a memory cell. The control method includes steps as follows: determining whether a retention signal is enabled; when the retention signal is enabled, generating a second data from a first data through the flip-flop, and temporarily storing the second data in the retention cell; during a period that the retention cell temporarily stores the second data, stop supplying power to the flip-flop and source circuits of the first data; and storing the second data temporarily stored by the retention cell to the memory cell.

Based on the above, to reduce additional power consumed by the core elements or other circuits during the period that the data is stored from the volatile memory to the non-volatile memory cell, the non-volatile memory device according to the embodiments of the disclosure is provided with the retention cell between the volatile memory and non-volatile memory cell. When the data is to be stored from the volatile memory to the non-volatile memory cell, the data may be temporarily stored by the retention cell, the power to the volatile memory and other components is turned off, and then the data temporarily stored by the retention cell is stored to the non-volatile memory cell. In this way, the stand-by power consumption of other core elements and part of the circuits may be reduced during data storing, so as to reduce the power consumption of the non-volatile memory device.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
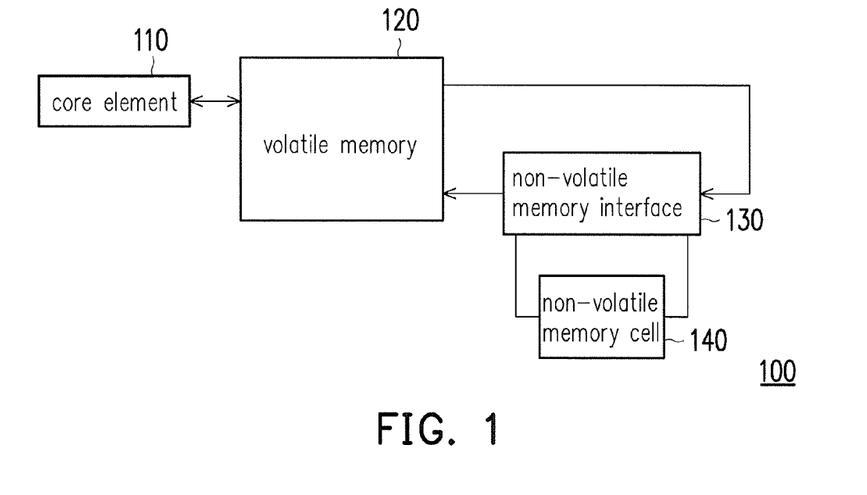
FIG. 1 is a schematic view illustrating a memory structure in a system-on-chip (SOC).

FIG. 1 is a schematic view illustrating a memory structure 100 in a system-on-chip (SOC). The system-on-chip may include one or more core elements 110. A volatile memory 120 may be disposed in each core element 110. When the system-on-chip is in an active mode, the core element 110 may be operated normally through the volatile memory 120. However, when the system-on-chip enters a normally-off mode to reduce power consumption, data in the volatile memory 120 is then stored to a non-volatile memory cell 140 through a non-volatile memory interface 130. Also, except for power supply to a main processor, power supply to other elements is turned off after the data is stored to the non-volatile memory cell 140. However, since it takes longer time to store the data from the volatile memory 120 to the non-volatile memory cell 140, each core element 110 is still idling and consumes power during storing. Therefore, there may still be additional power consumption.

Figure 2:
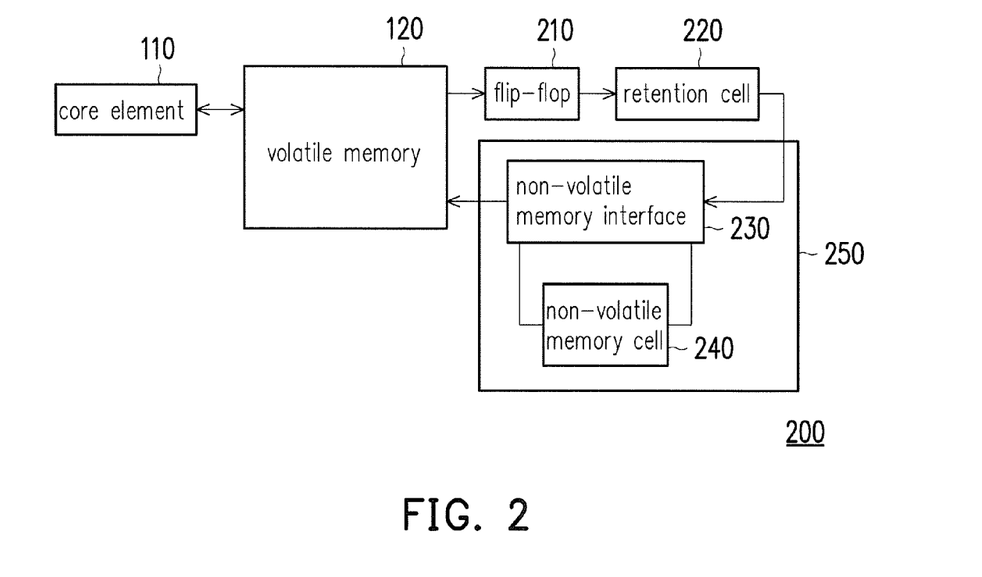
FIG. 2 is a schematic view illustrating a non-volatile memory device according to an embodiment of the disclosure.

A non-volatile memory device 200 according to an embodiment of the disclosure, however, has a flip-flop and a retention cell disposed between the volatile memory 120 and the non-volatile memory interface 130 to temporarily store the data to be stored to the non-volatile memory cell in the retention cell, so as to avoid additional power consumption of the system-on-chip when the data is written to the non-volatile memory cell, as shown in FIG. 2. FIG. 2 is a schematic view illustrating the non-volatile memory device 200 according to an embodiment of the disclosure. The non-volatile memory device 200 includes a flip-flop 210, a retention cell 220, and a memory cell 250. The memory cell 250 is formed by a non-volatile memory interface 230 and a non-volatile memory cell 240. When the data in the volatile memory 120 is going to be stored to the memory cell 250, the non-volatile memory device 200 firstly transfers the data to the retention cell 220 through the flip-flop 210, and then turns off power of the volatile memory 120 and source circuits or the core element 110 as data source. Then, the data in the retention cell 220 is stored in the non-volatile memory cell 240 through the non-volatile memory interface 230. When data storing is completed, power supply to each component in the system-on-chip may be turned off to save power. Also, when the system-on-chip needs to return to the active mode, the data in the non-volatile memory cell 140 may be restored to the volatile memory 120 directly without through the retention cell 220. Details regarding embodiments conforming to the disclosure are described in the following.

Figure 3:
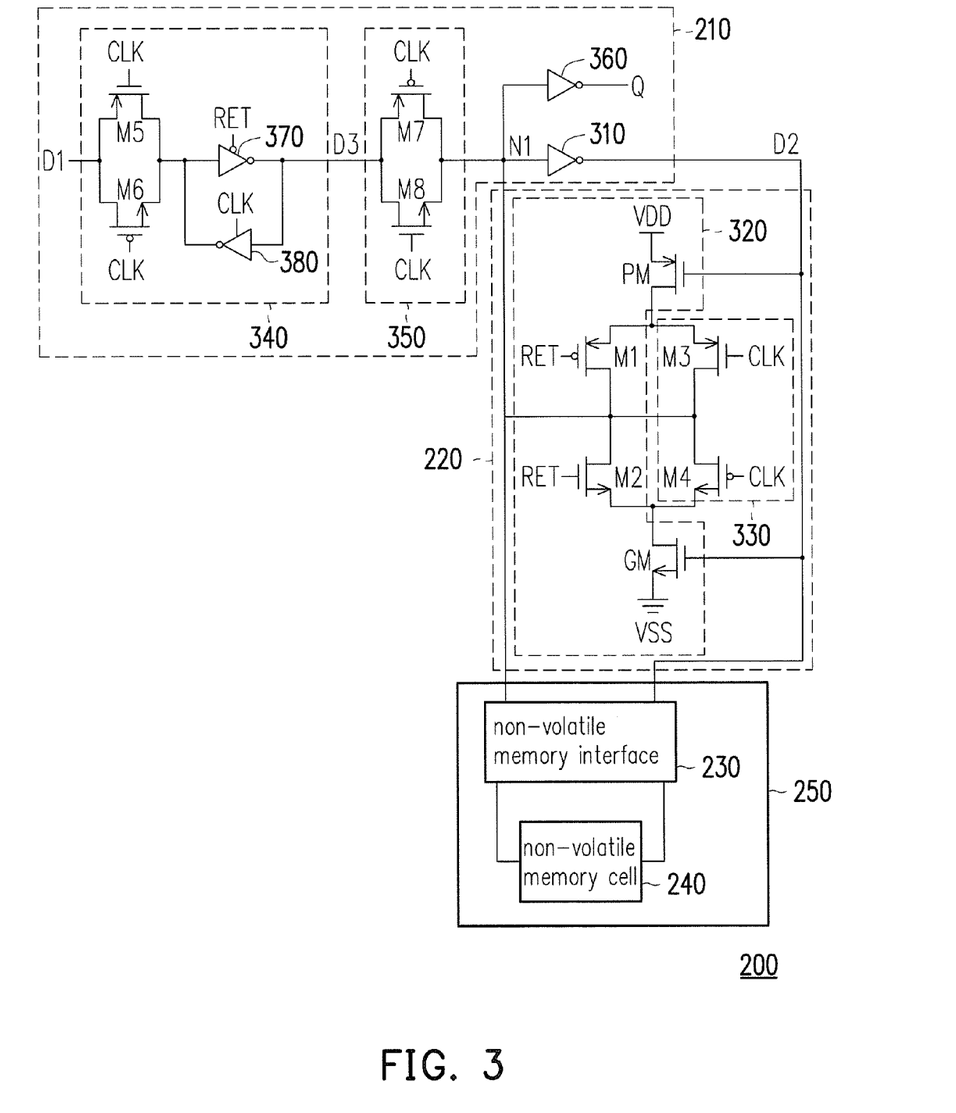
FIG. 3 is a circuit diagram illustrating a non-volatile memory device according to a first embodiment of the disclosure.

FIG. 3 is a circuit diagram illustrating a non-volatile memory device 200 according to a first embodiment of the disclosure. FIG. 3 mainly describes circuit structures of the flip-flop 210 and the retention cell 220. The flip-flop 210 mainly includes an output inverter 310. The flip-flop 210 generates a second data D2 according to a first data D1 and a retention signal RET. The retention cell 220 is coupled to the output inverter 310 of the flip-flop 210, and it temporarily stores the second data D2 when the retention signal RET is enabled. The non-volatile memory cell 250 is coupled to the flip-flop 210 and the retention cell 220. The memory cell 250 is configured to store the second data D2 temporarily stored by the retention cell 220. In other words, when the retention signal RET is enabled, the flip-flop 210 generates the second data D2 according to the first data D1. Then, the retention cell 220 temporarily stores the second data D2. During the retention cell 220 temporarily stores the second data D2, the system-on-chip stops supplying power to the flip-flop 210, but it still maintains power supply to the output inverter 310, and the non-volatile memory cell 250 stores the second data D2 temporarily stored by the retention cell 220. When a storing operation of the non-volatile memory cell 250 is completed, the power to each component in the system-on-chip may be turned off to save power. In this embodiment, temporary storage of the second data D2 may be realized by the retention cell 220 working with the output inverter 310 through an inverter. However, other circuits may be used to realize applications using this embodiment. For example, a simple latch or a cross-coupling pair circuit may be used to realize the retention cell 220.

Here, the circuit structures of the retention cell 220 and the flip-flop 210 in the first embodiment of the disclosure are described in detail. The retention cell 220 includes a first inverter 320 and a first switch 330. In the active mode, the first switch 330 may form another inverter with a power transistor PM and a ground transistor GM. An input end of the first inverter 320 is coupled to an output end of the output inverter 310, an output end of the first inverter 320 is coupled to an input end of the output inverter 310, and a control end of the first inverter 320 receives the retention signal RET. In this embodiment, the first inverter 320 may be realized by the power transistor PM, the ground transistor GM, a first transistor M1, and a second transistor M2. A first end (source end) of the power transistor PM is coupled to a power voltage VDD, and a control end (gate end) of the power transistor PM is coupled to the output end of the output inverter 310 to receive the second data D2. A first end (source end) of the ground transistor GM is coupled to a ground voltage VSS. A control end (gate end) of the ground transistor GM is coupled to the output end of the output inverter 310 to receive the second data D2. A first end (source end) of the first transistor M1 is coupled to a second end (drain end) of the power transistor PM, and a second end (drain end) of the first transistor M1 is coupled to the input end of the output inverter 310. Also, a control end of the first transistor M1 receives the inverted retention signal RET. A first end (source end) of the second transistor M2 is coupled to a second end (drain end) of the ground transistor GM, and a second end (drain end) of the second transistor M2 is coupled to the input end of the output inverter 310 and the drain end of the first transistor M1. A control end of the second transistor M2 receives the retention signal RET.

In this embodiment, the first switch 330 is realized by transistors M3 and M4 controlled by a clock signal CLK. A first end (source end) of the third transistor M3 is coupled to the second end of the power transistor PM, a second end (drain end) of the third transistor M3 is coupled to the input end of the output inverter 310, and a control end of the third transistor M3 receives the clock signal CLK. A first end (source end) of the fourth transistor M4 is coupled to the second end of the ground transistor GM, and a second end (drain end) of the fourth transistor M4 is coupled to the input end of the output inverter 310. A control end (gate end) of the fourth transistor M4 receives the inverted clock signal CLK.

In addition to the output inverter 310, the flip-flop further includes a latch 340, a second switch 350, and an inverter 360. An input end of the latch 340 receives the first data D1. The latch 340 converts the first data D1 into a third data D3 according to the clock signal CLK and the retention signal RET, and transmits the third data D3 to an output end of the latch 340. An input end of the second switch 350 is coupled to the output end of the latch 340 to receive the third data D3. The second switch 350 transmits the third data D3 to an output end of the second switch 350 and the input end of the output inverter 310 according to the clock signal CLK. The output inverter 310 converts the third data D3 into the second data D2. An input end of the inverter 360 is coupled to the output end of the second switch 350, and an output end of the inverter 360 outputs a signal Q.

Specifically, the latch 340 includes a fifth transistor M5, a sixth transistor M6, a second inverter 370, and a third inverter 380. A first end (source end) of the fifth transistor M5 serves as the input end of the latch 340 to receive the first data D1. A control end (gate end) of the fifth transistor M5 receives the clock signal CLK. A first end (drain end) of the sixth transistor M6 serves as the input end of the latch 340 to receive the first data D1. A control end (gate end) of the sixth transistor M6 receives the inverted clock signal CLK. A second end (drain end) of the fifth transistor M5 and a second end (source end) of the sixth transistor M6 are coupled to each other. An input end of the second inverter 370 is coupled to the second ends of the fifth and sixth transistors M5 and M6. An output end of the second inverter 370 serves as the output end of the latch 340. A control end of the second inverter 370 receives the inverted retention signal RET. An input end of the third inverter 380 is coupled to the output end of the second inverter 370. An output end of the third inverter 380 is coupled to the input end of the second inverter 370, and a control end of the third inverter 380 receives the clock signal CLK.

The second switch 350 may be realized by a seventh transistor M7 and an eighth transistor M8. A first end (source end) of the seventh transistor M7 is coupled to the output end of the latch 340. A second end (drain end) of the seventh transistor M7 serves as the output end of the second switch 350. A control end of the seventh transistor M7 receives the inverted clock signal CLK. A first end (drain end) of the eighth transistor M8 is coupled to the output end of the latch 340, a second end (source end) of the eighth transistor M8 serves as the output end of the second switch 350, and a control end of the eighth transistor M8 receives the clock signal CLK.

According to the circuit structures of the flip-flop 210 and the retention cell 220 shown in FIG. 3, when the clock signal CLK is at a low logic level, the fifth transistor M5 and the sixth transistor M6 are turned on so as to transmit the first data D1 to the second inverter 370. When the clock signal CLK is enabled (e.g. at a high logic level), and the retention signal RET is not enabled (e.g. at a low logic level), the second inverter 370 and the third inverter 380 are enabled to latch the first data D1, and the seventh transistor M7 and the eighth transistor M8 are turned on. Thus, the flip-flop 210 may transmit the first data D1 to the output inverter 310 through the latch 340 and the second switch 350 so as to generate the second data D2. When the retention signal RET is enabled (e.g. at a high logic level), the first transistor M1 and the second transistor M2 in the first inverter 320 are turned on, such that the second data D2 may be stored in the retention cell 220. When the retention signal RET is enabled, operation of the retention cell 220 is not influenced regardless of the logic level of the clock signal CLK. For example, if the second data D2 is "logic 0" and the retention signal RET is "logic 1", the power transistor PM and the first transistor M1 are turned on so that the second data D2 is temporarily stored through a path between the power transistor PM, the first transistor M1, and the output inverter 310. On the contrary, if the second data D2 is "logic 1", and the retention signal RET is also "logic 1", the ground transistor GM and the second transistor M2 are turned on so that the second data D2 is temporarily stored through a path between the ground transistor GM, the second transistor M2, and the output inverter 310. When the second data D2 is temporarily stored between the retention cell 220 and the output inverter 310, power supply to the flip-flop 210 and source circuits or the core elements of the first data D1 may be turned off so as to reduce additional power consumption. However, power supply to the output inverter 310 is maintained. Then, the memory cell 250 stores the second data D2 temporarily stored by the retention cell 220 to the non-volatile memory cell 240.

Figure 4:
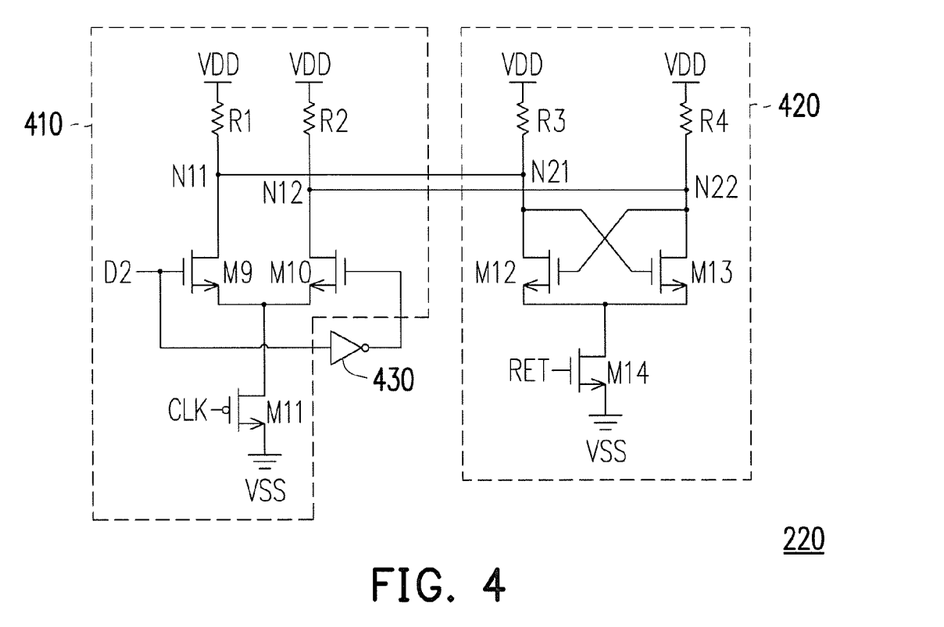
FIG. 4 is a circuit diagram illustrating another type of a retention cell of FIG. 3 according to another embodiment of the disclosure.

FIG. 4 is a circuit diagram illustrating another type of the retention cell 220 of FIG. 3 according to another embodiment of the disclosure. The retention cell 220 of this embodiment is realized by a cross-coupling pair circuit. In this embodiment, the retention cell 220 includes a differential pair element 410, a cross-coupling pair element 420, and a fourth inverter 430. A first input end (i.e. a control end of a ninth transistor M9) of the differential pair element 410 is coupled to the output end of the output inverter 310 shown in FIG. 3 to receive the second data D2. A first output end N11 of the differential pair element 410 is coupled to the input end (or terminal N1 shown in FIG. 3) of the output inverter 310 shown in FIG. 3. A second input end (i.e. a control end of a tenth transistor M10) of the differential pair element 410 is coupled to the output end of the output inverter 310 shown in FIG. 3 through the fourth inverter 430. A first terminal N21 and a second terminal N22 of the cross-coupling pair element 420 is coupled to the first output end N11 and a second output end N12 of the differential pair element 410. The cross-coupling pair element 420 is configured to temporarily store the second data D2.

Specifically, the differential pair element 410 includes the ninth transistor M9, the tenth transistor M10, and an eleventh transistor M11. The first end N11 (drain end) of the ninth transistor M9 is coupled to the output end of the output inverter 310 shown in FIG. 3 to serve as the first output end N11 of the differential pair element 410. The control end of the ninth transistor M9 is coupled to the output end of the output inverter 310 shown in FIG. 3, and it serves as the first input end of the differential pair element 410. A first end (drain end) of the tenth transistor M10 serves as the second output end of the differential pair element 410. The control end of the tenth transistor M10 serves as the second input end of the differential pair element 410. A first end (drain end) of the eleventh transistor M11 is coupled to second ends (source ends) of the ninth transistor M9 and the tenth transistor M10. A second end (source end) of the eleventh transistor M11 is coupled to the ground voltage VSS. A control end of the eleventh transistor M11 receives the inverted clock signal CLK. A resistor R1 is connected between the power voltage VDD and the first output end N11 of the differential pair element 410, and a resistor R2 is connected between the power voltage VDD and the second output end N12 of the differential pair element 410.

The cross-coupling pair element 420 includes a twelfth transistor M12, a thirteenth transistor M13, and a fourteenth transistor M14. A first end (drain end) of the twelfth transistor M12 is coupled to the first output end of the differential pair element 410 to serve as the first terminal N21 of the cross-coupling pair element 420. A first end (drain end) of the thirteenth transistor M13 is coupled to the second output end of the differential pair element 410 to serve as the second terminal N22 of the cross-coupling pair element 420. A control end of the thirteenth transistor M13 is coupled to the first terminal N21 of the cross-coupling pair element 420, and a control end of the twelfth transistor M12 is coupled to the second terminal N22 of the cross-coupling pair element 420. A first end (drain end) of the fourteenth transistor M14 is coupled to second ends (source ends) of the twelfth transistor M12 and the thirteenth transistor M13. A second end (source end) of the fourteenth transistor M14 is coupled to the ground voltage VSS. A control end of the fourteenth transistor M14 receives the retention signal RET. A resistor R3 is connected between the power voltage VDD and the first terminal N21 of the cross-coupling pair element 420, and the resistor R4 is connected between the power voltage VDD and the second terminal N22 of the cross-coupling pair element 420. Thus, when the retention signal RET is enabled, the second data D2 is temporarily stored by the cross-coupling pair element 420.

In this embodiment, the non-volatile memory device 200 shown in FIG. 3 may also be applied to the sleep mode when the retention signal RET is enabled so as to be distinguished from the active mode and the normally-off mode in the conventional art. The sleep mode of the non-volatile memory device 200 may coexist with the active mode and the normally-off mode. Those applying this embodiment may also replace the normally-off mode with the sleep mode. However, the disclosure is not limited thereto.

Figure 5:
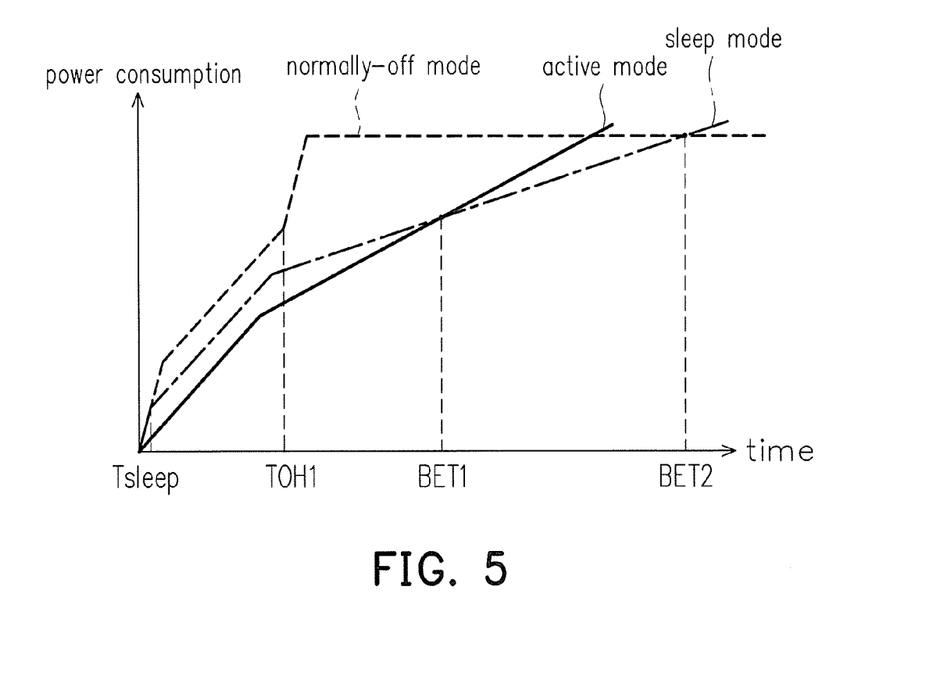
FIG. 5 is a schematic view illustrating power consumption of a non-volatile memory device according to an embodiment of the disclosure in an active mode, a normally-off mode, and a sleep mode.

FIG. 5 is a schematic view illustrating power consumption of the non-volatile memory device 200 according to an embodiment of the disclosure in the active mode, the normally-off mode, and the sleep mode. In this embodiment, the system-on-chip in the active mode may supply power to all the components to operate normally. In the normally-off mode, the system-on-chip maintains power supply to a main controller, but power supply to other components are turned off after the data is transmitted to and stored to the memory cell. The system-on-chip in the sleep mode of this embodiment only supplies power to the main controller and the memory cell after the data is stored to the memory cell. Tsleep, TOH1, BET1, and BET2 here represent specific time points. In addition, when system execution time exceeds the time point BET1, power consumption in the sleep mode is less than power consumption in the active mode. When the system execution time exceeds the time point BET2, power consumption in the normally-off mode is less than the power consumption of the sleep mode. With illustration of FIG. 5, it can be clearly known that in an application requiring constantly switching between the modes, the non-volatile memory device 200 in the sleep mode saves more time and power than in the other two modes. Besides, the non-volatile memory device 200 according to the embodiments of the disclosure may be used in relevant components such as a memory controller, a system controller, a real time clock (RTC) component, etc., in the system-on-chip.

Figure 6:
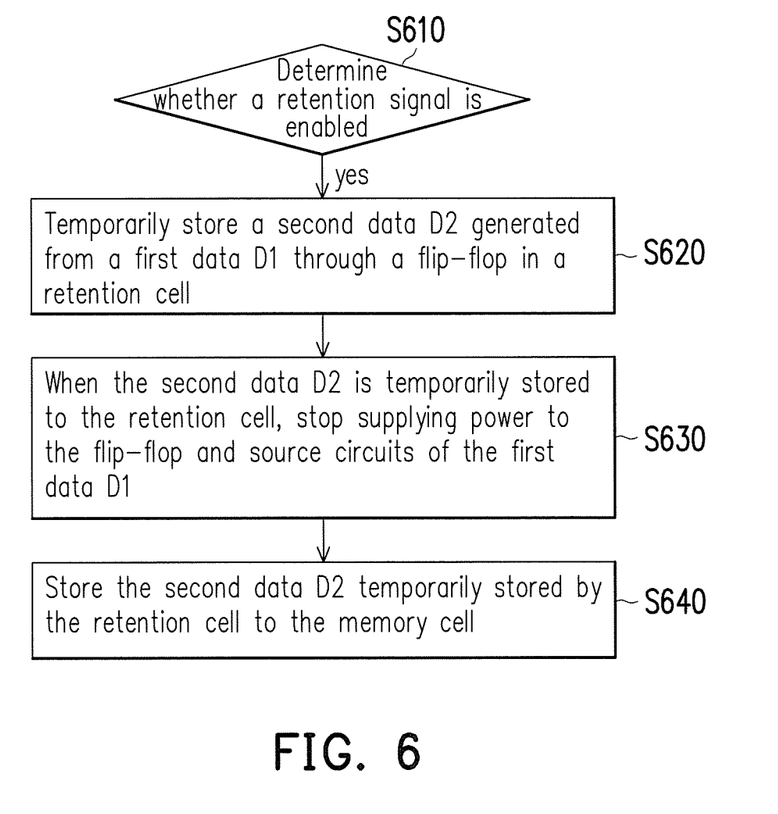
FIG. 6 is a flowchart illustrating a control method of a non-volatile memory device according to an embodiment of the disclosure.

FIG. 6 is a flowchart illustrating a control method of a non-volatile memory device according to an embodiment of the disclosure. Referring to FIGS. 3 and 6 together, the non-volatile memory device 200 using the control method includes the flip-flop 210, the retention cell 220, and the memory cell 250. The flip-flop 210 may receive the first data D1 and correspondingly generate the second data D2. At Step S610, the non-volatile memory device 200 determines whether the retention signal RET is enabled. When the retention signal RET is enabled, Step S620 is carried out to temporarily store the second data D2 generated from the first data D1 through the flip-flop 210 in the retention cell 220. At Step S630, during the period that the retention cell 220 temporarily stores the second data D2, the non-volatile memory device 200 stops supplying power to the flip-flop 210 and the source circuits of the first data D1, but the power supply to the output inverter 310 is maintained. At Step S640, the non-volatile memory device 200 stores the second data D2 temporarily stored by the retention cell 220 in the memory cell 250. Then, the non-volatile memory device 200 may turn off the power of all the components to save power.

In view of the foregoing, to reduce additional power consumed by the core elements or other circuits during the period that the data is stored from the volatile memory to the non-volatile memory cell, the non-volatile memory device according to the embodiments of the disclosure is provided with the retention cell between the volatile memory and non-volatile memory cell. When the data is to be stored from the volatile memory to the non-volatile memory cell, the data may be temporarily stored by the retention cell, the power to the volatile memory and other components is turned off, and then the data temporarily stored by the retention cell is stored to the non-volatile memory cell. In this way, the stand-by power consumption of other core elements and part of the circuits may be reduced during data storing so as to reduce the power consumption of the non-volatile memory device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A non-volatile memory device, comprising:
a flip-flop, comprising an output inverter, wherein the flip-flop generates a second data according to a first data and a retention signal;
a retention cell, coupled to the output inverter of the flip-flop, wherein the retention cell temporarily stores the second data when the retention signal is enabled; and
a memory cell, coupled to the inverter and the retention cell, wherein the memory cell stores the second data,
wherein two terminals of the memory cell are directly coupled to ends of the output inverter.

2. The non-volatile memory device as claimed in claim 1, wherein when the retention signal is enabled, the retention cell temporarily stores the second data, and during the retention cell temporarily stores the second data, power supply to the flip-flop is turned off, but power supply to the output inverter is maintained, and the memory cell stores the second data temporarily stored by the retention cell.

3. The non-volatile memory device as claimed in claim 1, wherein the retention cell comprises:
a first inverter, wherein an input end of the first inverter is coupled to an output end of the output inverter, an output end of the first inverter is coupled to an input end of the output inverter, and a control end of the first inverter receives the retention signal; and
a first switch, wherein the first switch is disposed between the input end of the first inverter and the output end of the output inverter, and a control end of the first switch receives a clock signal.

4. The non-volatile memory device as claimed in claim 3, wherein the first inverter comprises:
a power transistor, wherein a first end of the power transistor is coupled to a power voltage, and a control end of the power transistor is coupled to the output end of the output inverter;
a ground transistor, wherein a first end of the ground transistor is coupled to a ground voltage, and a control end of the ground transistor is coupled to the output end of the output inverter;
a first transistor, wherein a first end of the first transistor is coupled to a second end of the power transistor, a second end of the first transistor is coupled to the input end of the output inverter, and a control end of the first transistor receives an inverted retention signal; and
a second transistor, wherein a first end of the second transistor is coupled to a second end of the ground transistor, a second end of the second transistor is coupled to the input end of the output inverter, and a control end of the second transistor receives the retention signal.

5. The non-volatile memory device as claimed in claim 4, wherein the first switch comprises:

a third transistor, wherein a first end of the third transistor is coupled to the second end of the power transistor, a second end of the third transistor is coupled to the input end of the output inverter, and a control end of the third transistor receives the clock signal; and a fourth transistor, wherein a first end of the fourth transistor is coupled to the second end of the ground transistor, a second end of the fourth transistor is coupled to the input end of the output inverter, and a control end of the fourth transistor receives an inverted clock signal.

6. The non-volatile memory device as claimed in claim 1, wherein the flip-flop further comprises:

a latch, wherein an input end of the latch receives the first data, and the latch converts the first data into a third data according to a clock signal and the retention signal, and it transmits the third data to an output end of the latch; and a second switch, wherein an input end of the second switch is coupled to the output end of the latch, and the third data is transmitted to an output end of the second switch according to the clock signal, wherein an input end of the output inverter is coupled to the output end of the second switch, and the output inverter converts the third data into the second data.

7. The non-volatile memory device as claimed in claim 6, wherein the latch comprises:

a fifth transistor, wherein a first end of the fifth transistor serves as the input end of the latch to receive the first data, and a control end of the fifth transistor receives the clock signal;

a sixth transistor, wherein a first end of the sixth transistor serves as the input end of the latch to receive the first data, a control end of the sixth transistor receives an inverted clock signal, and second ends of the fifth and sixth transistors are coupled to each other;

a second inverter, wherein an input end of the second inverter is coupled to the second ends of the fifth and sixth transistors, an output end of the second inverter serves as the output end of the latch, and a control end of the second inverter receives an inverted retention signal; and a third inverter, wherein an input end of the third inverter is coupled to the output end of the second inverter, an output end of the third inverter is coupled to the input end of the second inverter, and a control end of the third inverter receives the clock signal.

8. The non-volatile memory device as claimed in claim 6, wherein the second switch comprises:

a seventh transistor, wherein a first end of the seventh transistor is coupled to the output end of the latch, a second end of the seventh transistor serves as an output end of the second switch, and a control end of the seventh transistor receives an inverted clock signal; and an eighth transistor, wherein a first end of the eighth transistor is coupled to the output end of the latch, a second end of the eighth transistor serves as the output end of the second switch, and a control end of the eighth transistor receives the clock signal.

9. The non-volatile memory device as claimed in claim 1, wherein the retention cell comprises:

a differential pair element, wherein a first input end of the differential pair element is coupled to an output end of the output inverter, and a first output end of the differential pair element is coupled to an input end of the output inverter;

a fourth inverter, wherein a second input end of the differential pair element is coupled to the output end of the output inverter through the fourth inverter; and a cross-coupling pair element, wherein a first terminal and a second terminal of the cross-coupling pair element are respectively coupled to the first output end and a second output end of the differential pair element, wherein the cross-coupling pair element is configured to temporarily store the second data.

10. The non-volatile memory device as claimed in claim 9, wherein the differential pair element comprises:

a ninth transistor, wherein a first end of the ninth transistor is coupled to the input end of the output inverter to serve as the first output end of the differential pair element, and a control end of the ninth transistor is coupled to the output end of the output inverter to serve as the first input end of the differential pair element;

a tenth transistor, wherein a first end of the tenth transistor serves as the second output end of the differential pair element, and a control end of the tenth transistor serves as the second input end of the differential pair element; and an eleventh transistor, wherein a first end of the eleventh transistor is coupled to second ends of the ninth transistor and the tenth transistor, a second end of the eleventh transistor is coupled to a ground voltage, and a control end of the eleventh transistor receives an inverted clock signal.

11. The non-volatile memory device as claimed in claim 9, wherein the cross-coupling pair element comprises:

a twelfth transistor, wherein a first end of the twelfth transistor is coupled to the first output end of the differential pair element to serve as the first terminal of the cross-coupling pair element;

a thirteenth transistor, wherein a first end of the thirteenth transistor is coupled to the second output end of the differential pair element to serve as the second terminal of the cross-coupling pair element, a control end of the thirteenth transistor is coupled to the first terminal of the cross-coupling pair element, and a control end of the twelfth transistor is coupled to the second terminal of the cross-coupling pair element; and a fourteenth transistor, wherein a first end of the fourteenth transistor is coupled to second ends of the twelfth transistor and the thirteenth transistor, a second end of the fourteenth transistor is coupled to a ground voltage, and a control end of the fourteenth transistor receives the retention signal.

12. A control method of a non-volatile memory device, wherein the non-volatile memory device comprises a flip-flop, a retention cell, and a memory cell, the control method comprising:

determining whether a retention signal is enabled;

when the retention signal is enabled, generating a second data from a first data through the flip-flop, and temporarily storing the second data in the retention cell;

during the retention cell temporarily stores the second data, stop supplying power to the flip-flop and source circuits of the first data; and storing the second data temporarily stored by the retention cell to the memory cell, wherein the flip-flop comprises an output terminal, and two terminals of the memory cell are directly coupled to ends of an output inverter.

13. The control method of the non-volatile memory device as claimed in claim 12, wherein the retention cell comprises:

a first inverter, wherein an input end of the first inverter is coupled to an output end of an output inverter of the flip-flop, an output end of the first inverter is coupled to an input end of the output inverter, and a control end of the first inverter receives the retention signal; and a first switch, wherein the first switch is disposed between the input end of the first inverter and the output end of the output inverter, and a control end of the first switch receives a clock signal.

14. The control method of the non-volatile memory device as claimed in claim 12, wherein the retention cell comprises:

a differential pair element, wherein a first input end of a differential pair element is coupled to an output end of an output inverter of the flip-flop, and a first output end of the differential pair element is coupled to an input end of the output inverter;

a fourth inverter, wherein a second input end of the differential pair element is coupled to the output end of the output inverter through the fourth inverter; and a cross-coupling pair element, wherein a first terminal and a second terminal of the cross-coupling pair element are respectively coupled to the first output end and a second output end of the differential pair element, wherein the cross-coupling pair element is configured to temporarily store the second data.

\* \* \* \* \*